United States Patent [19]
Zettler

[11] Patent Number: 6,137,315
[45] Date of Patent: Oct. 24, 2000

[54] DRIVE CIRCUIT FOR A NON-VOLATILE SEMICONDUCTOR STORAGE CONFIGURATION

[75] Inventor: Thomas Zettler, München, Germany

[73] Assignee: Infineon Technologies Aktiengesellschaft, Munich, Germany

[21] Appl. No.: 09/460,346

[22] Filed: Dec. 13, 1999

Related U.S. Application Data

[63] Continuation of application No. PCT/DE98/01560, Jun. 8, 1998.

[30] Foreign Application Priority Data

Jun. 13, 1997 [DE] Germany ............ 197 25 181

[51] Int. Cl.[7] .................. G11C 7/00; H03K 19/0175
[52] U.S. Cl. .................... 326/83; 326/80; 365/189.11
[58] Field of Search .............. 326/83, 80, 81, 326/49, 50; 365/189.11, 189.09, 154, 190

[56] References Cited

U.S. PATENT DOCUMENTS

| | | |
|---|---|---|
| 4,716,312 | 12/1987 | Mead et al. |
| 5,293,561 | 3/1994 | Nizaka . |
| 5,444,396 | 8/1995 | Soneda . |
| 5,682,345 | 10/1997 | Roohparvar et al. ............ 365/185.04 |
| 5,812,451 | 9/1998 | Iwata ................................ 365/185.11 |
| 5,864,499 | 1/1999 | Roohparvar et al. ............ 365/185.08 |

FOREIGN PATENT DOCUMENTS

| | | |
|---|---|---|
| 0154379A2 | 9/1985 | European Pat. Off. . |
| 0269468A1 | 6/1986 | European Pat. Off. . |
| 0208186A2 | 1/1987 | European Pat. Off. . |

OTHER PUBLICATIONS

"A 0.5 µm CMOS Technology for Multifunctional Applications with Embedded FN–Flash Memory and Linear R and C Modules", Roland Heinrich et al., International Electron Devices Meeting, 1993, Washington, DC, pp. 445–448.

"An Experimental 4–Mbit CMOS EEPROM with a NAND–Structured Cell", Masaki Momodomi et al., IEEE Journal of Solid–State Circuits, Oct. 1989, No. 5, New York, pp. 1238–1243.

*Primary Examiner*—Michael Tokar
*Assistant Examiner*—Daniel D. Chang
*Attorney, Agent, or Firm*—Herbert L. Lerner; Laurence A. Greenberg; Werner H. Stemer

[57] ABSTRACT

A drive circuit for a non-volatile semiconductor storage configuration. The drive circuit having a level converter circuit which applies an output value and a complementary output value complementary to the output value to a bit line and/or a word line of the semiconductor storage configuration. The drive circuit also has a latch circuit that temporarily stores the data to be stored in the semiconductor storage configuration, and lies between an input circuit and the level converter circuit.

2 Claims, 3 Drawing Sheets

FIG. 2
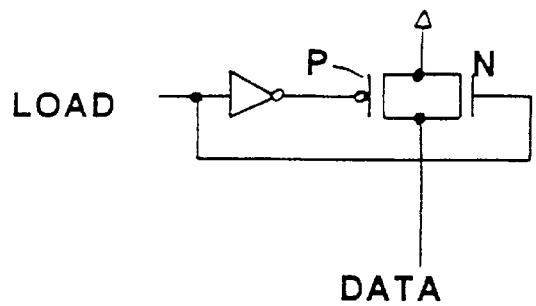
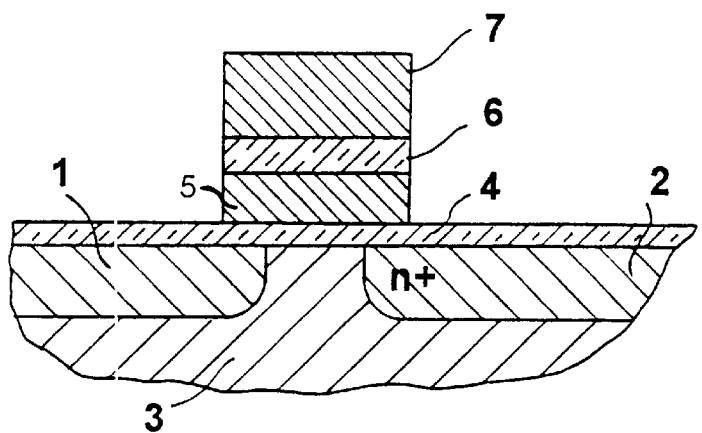
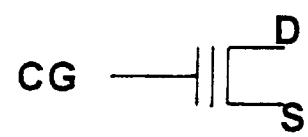
FIG. 3
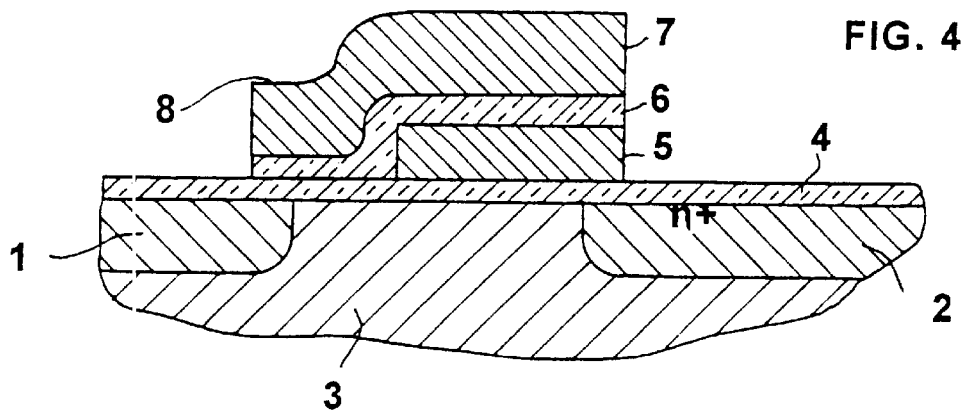
FIG. 4

DRIVE CIRCUIT FOR A NON-VOLATILE SEMICONDUCTOR STORAGE CONFIGURATION

CROSS-REFERENCE TO RELATED APPLICATION

This is a continuation of copending International Application PCT/DE98/01560, filed Jun. 8, 1998, which designated the United States.

BACKGROUND OF THE INVENTION

Field of the Invention

The present invention relates to a drive circuit for a non-volatile semiconductor storage configuration. The drive circuit has a level converter circuit which applies an output value and an output value complementary to this output value to a bit line and/or a word line of the semiconductor storage configuration and has a latch circuit (latch) which lies between an input circuit and the level converter circuit which temporarily stores the data to be stored in the semiconductor storage configuration.

Such a drive circuit is known from Published, European Patent Application EP 0 154 379 A2.

In order to add or remove charges, and therefore data, from the individual storage cells, non-volatile semiconductor storage configurations, for example flash memories and electrically erasable programmable read-only memories (EEPROM) require voltages typically of 15 V. These voltages, which are substantially higher than the normal supply voltage Vdd, which is of the order of 5 V, will also be referred to as "high voltages" below. Depending on the mode of operation, the high voltages are applied to word lines or bit lines, or to word lines and bit lines of a semiconductor storage configuration.

A stacked gate cell has a source region and a drain region in a semiconductor substrate. The source region and the drain region are both $n^+$-doped, while the semiconductor substrate has p-type doping. The source region and the drain region as well as the channel area of the semiconductor substrate between the source region and the drain region, are provided with a tunneling oxide layer of, for example, silicon dioxide. On the tunneling oxide layer, in the area between the drain region and the source region, there is a floating gate of, for example, polycrystalline silicon. On the floating gate, an interpoly dielectric and a control gate are further disposed.

In order to erase and program data, so-called "Fowler-Nordheim Tunneling" (FN tunneling) can be used in such a stacked gate cell. In an erasing process, for example 0 V is applied to the drain region and +15 V to the control gate. Electrons then tunnel from the channel area through the tunneling oxide layer into the floating gate. When programming, for example 0 V is applied to the control gate and +15 V to the drain region, which makes electrons tunnel from the floating gate through the tunneling oxide layer into the drain region. It is, however, also possible to apply, for example, –11 V to the control gate and +4 V to the drain region for programming. This also causes electrons to tunnel from the floating gate into the drain region.

When programming with hot electrons (hot e programming), for example +15 V is applied to the control gate, +5 V to the drain region and 0 V to the source region. As a result, electrons migrate from the drain region to the source region, and at the same time tunnel through the tunneling oxide layer into the floating gate.

It is known that an EEPROM can be programmed and erased bytewise, while a flash memory can be programmed bytewise using hot electrons or FN tunneling, and erased blockwise by FN tunneling.

As an example of another type of storage cell, a so-called split gate cell having the semiconductor substrate, the $n^+$-doped source region, the $n^+$-doped drain region, the tunneling oxide layer, the floating gate, the interpoly dielectric and the control gate. The "lowered" part of the control gate is also referred to as a series gate, since the raised control gate and the series gate can be regarded as interconnected gates of two NMOS transistors connected in series.

Storage cells of the above-mentioned type can form a semiconductor memory having bit lines BL0 word lines.

In a semiconductor storage configuration, it is necessary to be able to apply high voltages selectively to chosen word lines or bit lines, in order to erase or program individual storage cells. Besides semiconductor storage configurations, however, it is also necessary for specially regulated voltages with greater consistency than the supply voltage to be switched by high voltages of, for example, 15 V.

One important application is, for example, the driving of the bit lines in flash memories with negative programming voltage (see e.g. R. Heinrich, W. Heinrigs, G. Tempel, J. Winnerl, T. Zettler, in Proc. of the International Electron Device Meeting (IEDM), 1993, pages 445 to 448). In order to achieve constant programming conditions, the bit line voltage is, for example, regulated to 5 V in this case while –12 V is applied to the word lines. Such regulated voltages of, for example, 5 V, which lie below the supply voltage of 5.5 V, will also be covered below by the term "high voltage".

In order to produce such drive voltages, it is necessary to have a drive circuit that is to deliver the desired voltages with a high level of consistency and at the same time requiring little space.

Specifically, U.S. Pat. No. 5,293,761 describes a drive circuit having a voltage divider circuit for separately supplying the memory array and memory for a redundant configuration with high voltages. The known drive circuit has, in particular, a level converter circuit which makes it possible to apply an output value, and an output value complementary to the output value, to a semiconductor storage configuration.

It has, however, been shown that the known drive circuit according to U.S. Pat. No. 5,293,561 is unsuitable for driving bit lines since it does not allow any temporary storage of data. Further, the known drive circuit contains NMOS transistors of the depletion type which, as additional components, entail considerable technical complexity.

In contrast, the drive circuit according to Published, European Patent Application EP 0 154 379 A2 contains a large number of PMOS transistors, which have a relatively large area requirement and a low current yield.

SUMMARY OF THE INVENTION

It is accordingly an object of the invention to provide a drive circuit for a non-volatile semiconductor storage configuration, which overcomes the above-mentioned disadvantages of the prior art devices of this general type, which can be produced with the fewest possible components on a small area, so that it can be constructed on the narrowest space in the grid of the storage matrix of the semiconductor storage configuration, and makes it possible to output the drive voltages with a high level of consistency even in the high-voltage range.

With the foregoing and other objects in view there is provided, in accordance with the invention, a drive circuit for a non-volatile semiconductor storage configuration, including:

a level converter circuit for applying an output value and a complementary output value complementary to the output value to at least one of a bit line and a word line of the non-volatile semiconductor storage configuration, the level converter circuit having a first control input and a second control input;

an input circuit having a data input, a first data output connected to the first control input of the level converter circuit, a second data output is connected to the second control input of the level converter circuit and is complementary to the first data output, a first NMOS transistor with a gate and a source-drain path lies between the data input and the first data output, and a series circuit consisting of a second and a third NMOS transistor to lie between ground and the second data output, the second NMOS transistor has a gate connected to the gate of the first NMOS transistor, and the third NMOS transistor has a gate connected to the data input; and a latch circuit for temporarily storing data to be stored in the non-volatile semiconductor storage configuration and disposed between the input circuit and the level converter circuit.

The input circuit is advantageously composed of a first NMOS transistor with its source-drain path lying between a data input and a first data output, and a series circuit consisting of a second and third NMOS transistors lying between ground and a second data output. The gate of the second NMOS transistor is connected to the gate of the first NMOS transistor and the gate of the third NMOS transistor is connected to the source or drain of the first NMOS transistor. It must be emphasized that such an input circuit can also be used separately from the drive circuit if it is desired to produce one signal and one signal inverted relative to it using a simple configuration.

The drive circuit according to the invention can be produced with few components on a small area, so that it can be accommodated on the narrowest space in the grid of the storage matrix of the semiconductor storage configuration. The input circuit is made of only three NMOS transistors, so that it can be produced particularly straightforwardly and favorably in terms of area, which is of the utmost importance for semiconductor storage configurations and their grids. Since no PMOS transistors are employed here, the input circuit can be accommodated in a common well, which leads to an additional advantage in terms of area. Because of the higher current yield of NMOS transistors compared to PMOS transistors, it is also possible for the overall circuit to have a particularly small layout.

The latch circuit may advantageously consist of two inverters connected in anti-parallel.

Other features which are considered as characteristic for the invention are set forth in the appended claims.

Although the invention is illustrated and described herein as embodied in a drive circuit for a non-volatile semiconductor storage configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS:

FIG. 2 is a circuit diagram of a CMOS transfer gate;

FIG. 3 is a sectional view of a stacked gate cell;

FIG. 4 is a sectional view of a split gate cell; and

DESCRIPTION OF THE PREFERRED EMBODIMENTS

Figure 1:
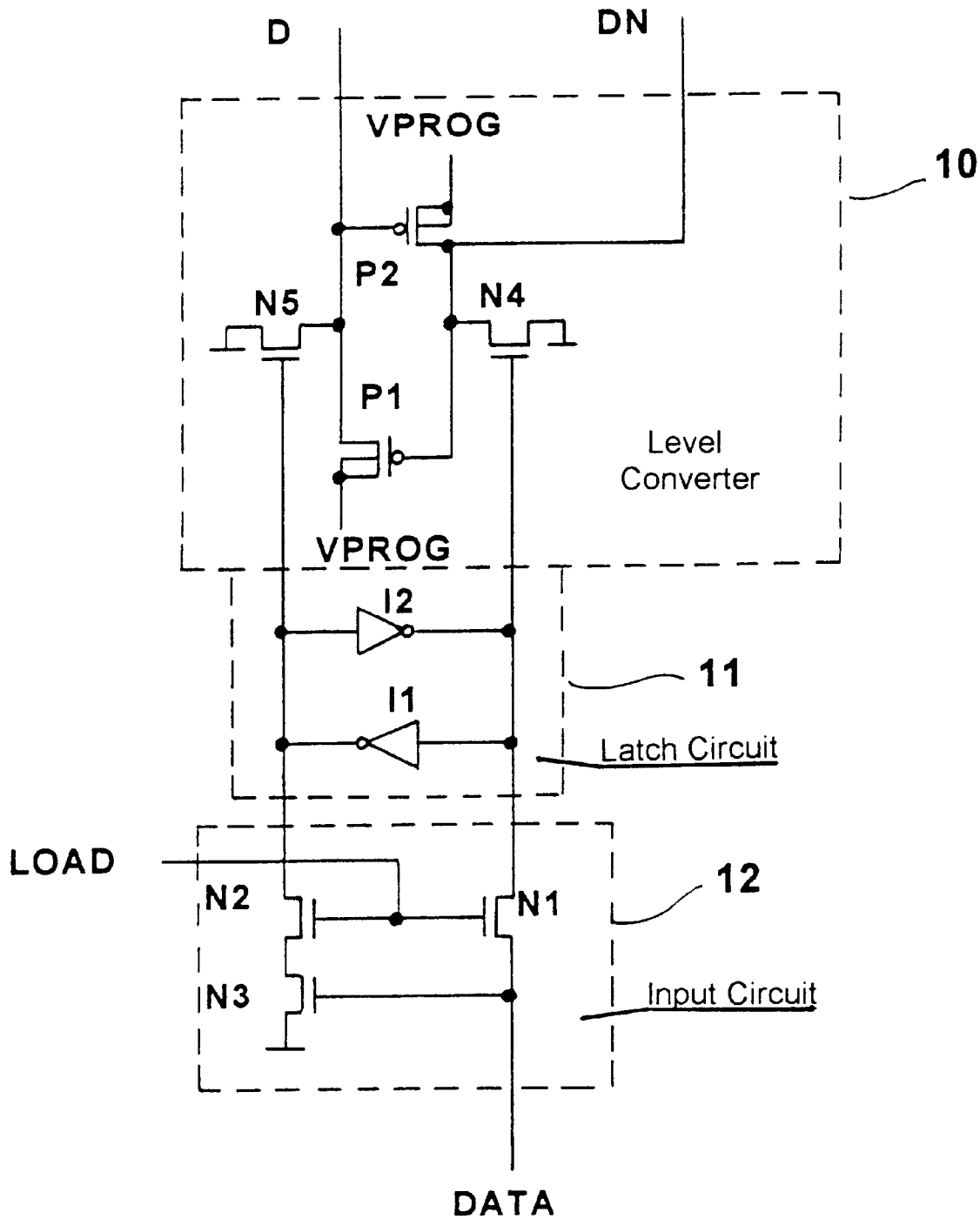
FIG. 1 diagrammatic, circuit diagram of a drive circuit according to the invention.

In all the figures of the drawing, sub-features and integral parts that correspond to one another bear the same reference symbol in each case. Referring now to the figures of the drawing in detail and first, particularly, to FIG. 3 thereof, there is shown a structure of a so-called stacked gate cell. The stacked gate cell has a source region 1 and a drain region 2 in a semiconductor substrate 3. The source region 1 and the drain region 2 are both $n^+$-doped, while the semiconductor substrate 3 has p-type doping. The source region 1 and the drain region 2 as well as a channel area of the semiconductor substrate 3 disposed between the source region 1 and the drain region 2, are provided with a tunneling oxide layer 4 of, for example, silicon dioxide. On the tunneling oxide layer 4, in the area between the drain region 2 and the source region 1, there is a floating gate 5 of, for example, made of polycrystalline silicon. On the floating gate 5, an interpoly dielectric 6 and a control gate 7 are further disposed.

In order to erase and program data, so-called "Fowler-Nordheim Tunneling" (FN tunneling) can be used in such a stacked gate cell. In an erasing process, for example 0 V is applied to the drain region 2 and +15 V to the control gate 7. Electrons then tunnel from the channel area through the tunneling oxide layer 4 into the floating gate 5. When programming, for example 0 V is applied to the control gate 7 and +15 V to the drain region 2, which makes electrons tunnel from the floating gate 5 through the tunneling oxide layer 4 into the drain region 2. It is, however, also possible to apply, for example, −11 V to the control gate 7 and +4 V to the drain region 2 for programming. This also causes electrons to tunnel from the floating gate 5 into the drain region 2.

When programming with hot electrons (hot e programming), for example +15 V is applied to the control gate 7, +5 V to the drain region 2 and 0 V to the source region 1. As a result, electrons migrate from the drain region 2 to the source region 1, and at the same time tunnel through the tunneling oxide layer 4 into the floating gate 5.

It is known that an EEPROM can be programmed and erased bytewise, while a flash memory can be programmed bytewise using hot electrons or FN tunneling, and erased blockwise by FN tunneling.

As an example of another type of storage cell, FIG. 4 shows a so-called split gate cell having the semiconductor substrate 3, the $n^+$-doped source region 1, the $n^+$-doped drain region 2, the tunneling oxide layer 4, the floating gate 5, the interpoly dielectric 6 and the control gate 7. The "lowered" part of the control gate 7 is also referred to as a series gate 8, since a raised control gate 7 and the series gate 8 can be regarded as interconnected gates of two NMOS transistors connected in series.

The s tack cell shown in FIG. 3 is portrayed by a symbol represented on the right in this figure, "CG" denoting the control gate 7, "ID" a connection of the d rain region 2 and "S" a connection of the source region 1.

Figure 5:
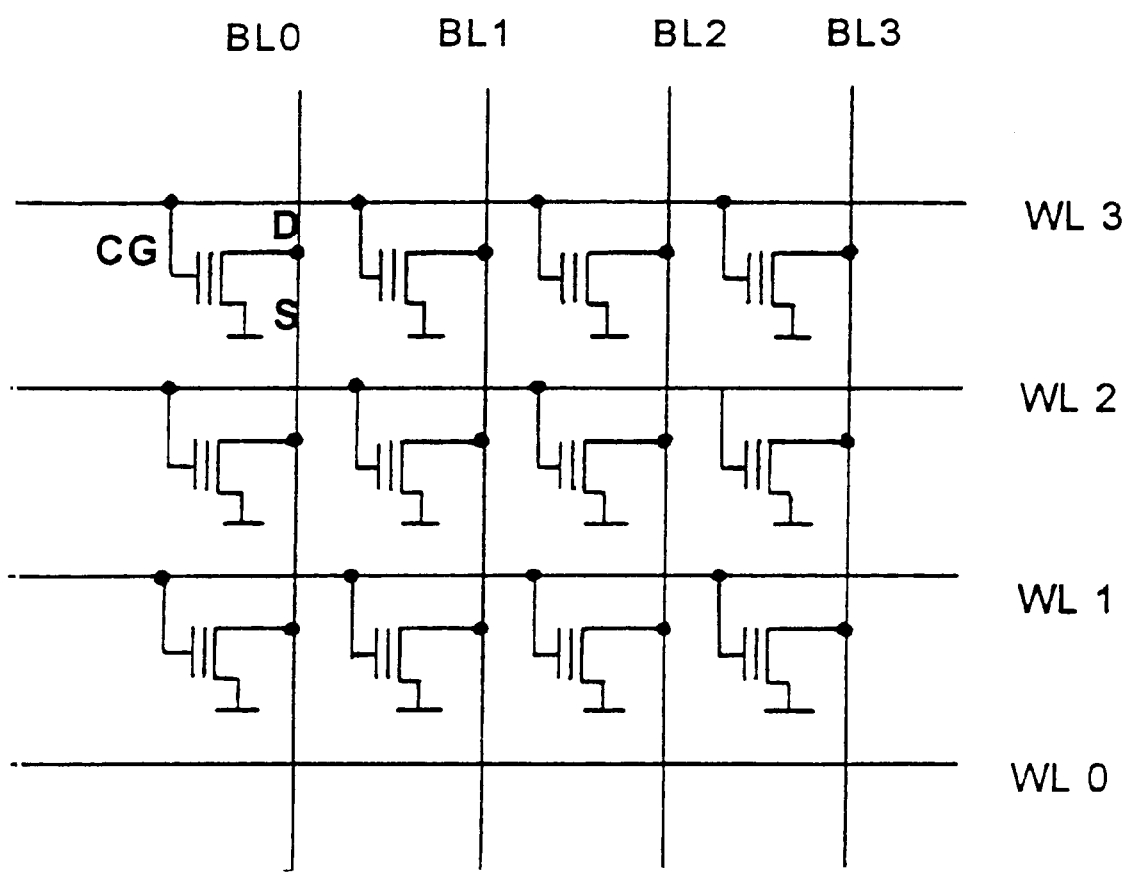
FIG. 5 is a circuit diagram of a storage cell matrix with word lines and bit lines.

Storage cells of the type shown in FIG. 3 can form a semiconductor memory having bit lines BL0, BL1, BL2, BL3 and word lines WL0, WL1, WL2 and WL3, as schematic ally indicated in FIG. 5.

In a semiconductor storage configuration, it is necessary to be able to apply high voltages selectively to chosen word lines or bit lines, in order to erase or program individual storage cells. Besides semiconductor storage configurations, however, it is also necessary for specially regulated voltages with greater consistency than the supply voltage to be switched b y high voltages of, for example, 15 V.

In FIG. 1, there is shown a circuit layout of a drive circuit according to the invention. The drive circuit consists of a level converter circuit 10, a latch circuit 11 and an input circuit 12. The level converter circuit 10 consists of PMOS transistors P1, P2 and NMOS transistors N4, N5, and has output connections D and DN, which are connected to bit lines and word lines of a semiconductor storage configuration. Depending on an input value, "1" or "0" which is applied to an input DATA, the output lines D and DN provide a voltage VPROG or 0 V. In this regard, the output connection DN is complementary to the output connection D and delivers 0 V or a voltage VPROG, when there is a respective voltage V of VPROG or 0 V at the output connection D.

An externally supplied voltage VPROG of, for example, 15 V is applied to a drain and source, respectively, of the PMOS transistors P1 and P2. The feeding of the voltage VPROG to the output connection D or DN is controlled by the transistors N4, N5, P1 and P2, the output DN being, as explained above, complementary to the output D.

A level converter circuit, which is similar to the level converter circuit 10, is known per se from the aforementioned U.S. Pat. No. 5,293,561.

Connected upstream of the level converter circuit 10 is the latch circuit 11, which consists of two mutually anti-parallel inverters I1 and I2. Upstream of the latch circuit 11 there is the input circuit 12 made up of three NMOS transistors N1 to N3. The data to be stored, that is to say, for example, 5 V for a data value "1", are fed to the input circuit via the input DATA. In this case, a source or drain of the transistor N1 is connected to the input DATA, the same being true for a gate of the transistor N3 which is connected in series with the transistor N2. The gates of the transistors N1 and N2 are connected to one another and are attached to a connection LOAD. If, for example, 5 V is applied to the connection LOAD, then the transistors N1 and N2 are turned on so that 0 V is applied to the input of the latch circuit 11 on the left in FIG. 1, while, for example, a data signal "1" of 5 V is fed via the transistor N1 to the input of the latch circuit 11 on the right in FIG. 1 (reduced by the threshold voltage of the transistor N1).

The drive circuit according to the invention is particularly suitable for data that are intended to be programmed in a non-volatile semiconductor storage configuration. The data are temporarily stored in the latch circuit 11, and a regulated voltage VPROG is made available to each bit line. In this application, the drive circuit is provided separately for each bit line and word line. The data to be programmed are applied to the input line DATA. Using a positive pulse at the connection LOAD, the data are then taken into the latch circuit 11. Depending on the input value "1" or "0" at the input connection DATA, the level converter circuit 10 then provides the voltage VPROG or 0 V at the output connections D and DN. The signal at the output connection DN is in this case complementary to the signal at the output connection D, and delivers 0 V or a voltage VPROG when the voltage at the output connection D has the value VPROG or 0 V, respectively.

The drive circuit according to the invention can, of course, be used on a bit line and/or word line for the general distribution of high voltages.

The input circuit 12 is merely made up of the three NMOS transistors N1, N2 and N3. It can therefore be produced particularly straightforwardly and favorably in terms of area occupied, which is of the utmost importance for memory grid circuits. Since no PMOS transistors are employed, this circuit part can be produced in a common well, which leads to a considerable advantage in terms of area. Depending on the input data, the input circuit 12 sets the node of the latch circuit on the right in FIG. 1, via the transistor N1 ("0" is applied to the input connection DATA) to 0 V or the node on the left, via the transistors N2 and N3, to 0 V.

Owing to the higher current yield of NMOS transistors compared with PMOS transistors, the input circuit 12 can be produced with a particularly small layout. In particular, the sum of the widths of the transistors N2 and N3 must be at most as large as the width of a PMOS transistor with a corresponding CMOS transfer gate (see FIG. 2). Further, only one signal LOAD is needed for driving the input circuit 12. An additional inverted signal, as is required per se in the case of a CMOS transfer gate, need not be used.

The drive circuit according to the invention does not need an additional input inverter for driving the transistors N4 and N5, and instead the function of the inverters I1 and I2 of the latch circuit is utilized for this. The advantageous combination of the latch circuit 11 with the level converter circuit 10 therefore saves on components and is therefore especially suitable for use in area-critical memory grid circuits.

I claim:

1. A drive circuit for a non-volatile semiconductor storage configuration, comprising:

a level converter circuit for applying an output value and a complementary output value complementary to the output value to at least one of a bit line and a word line of the non-volatile semiconductor storage configuration, said level converter circuit having a first control input and a second control input;

an input circuit having a data input, a first data output connected to said first control input of said level converter circuit, a second data output connected to said second control input of said level converter circuit and being complementary to said first data output, a first NMOS transistor with a gate and a source-drain path lying between said data input and said first data output, and a series circuit consisting of a second and a third NMOS transistor to lie between ground and said second data output, said second NMOS transistor having a gate connected to said gate of said first NMOS transistor, and said third NMOS transistor having a gate connected to said data input; and a latch circuit for temporarily storing data to be stored in the non-volatile semiconductor storage configuration and disposed between said input circuit and said level converter circuit.

2. The drive circuit according to claim 1, wherein said latch circuit has two inverters connected in anti-parallel.

* * * * *